US012199568B2

(12) United States Patent
Andreani (10) Patent No.: US 12,199,568 B2
(45) Date of Patent: Jan. 14, 2025

(54) OSCILLATOR WITH BIASED CROSS-COUPLED TRANSISTORS, A CURRENT SOURCE, A TAIL RESISTOR AND A TAIL CAPACITOR

(71) Applicant: Telefonaktiebolaget LM Ericsson (publ), Stockholm (SE)

(72) Inventor: Pietro Andreani, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 17/928,316

(22) PCT Filed: Jun. 4, 2020

(86) PCT No.: PCT/EP2020/065408
§ 371 (c)(1),
(2) Date: Nov. 29, 2022

(87) PCT Pub. No.: WO2021/244741
PCT Pub. Date: Dec. 9, 2021

(65) Prior Publication Data
US 2023/0208357 A1     Jun. 29, 2023

(51) Int. Cl.
*H03B 5/12* (2006.01)
(52) U.S. Cl.
CPC ......... *H03B 5/1215* (2013.01); *H03B 5/1228* (2013.01); *H03B 5/124* (2013.01); *H03B 2200/009* (2013.01); *H03B 2202/027* (2013.01)
(58) Field of Classification Search
CPC .... H03B 5/1215; H03B 5/1228; H03B 5/124; H03B 2200/009; H03B 2202/027; H03B 5/1243

(Continued)

(56) References Cited

U.S. PATENT DOCUMENTS 8,410,830 B2 * 4/2013 Mahdavi ............. H03B 5/1215
327/120
9,083,362 B2   7/2015 Ponton et al.
(Continued)

FOREIGN PATENT DOCUMENTS

KR     101000379 B1   12/2010

OTHER PUBLICATIONS

PCT International Search Report, mailed Feb. 24, 2021, in connection with International Application No. PCT/EP2020/065408 all pages.

(Continued)

*Primary Examiner* — Arnold M Kinkead
(74) *Attorney, Agent, or Firm* — Leffler Intellectual Property Law, PLLC (57) ABSTRACT

Embodiments disclosed herein relate to oscillators including methods of operating the same, for example for use in radio frequency circuits. In an embodiment, an oscillator has cross-coupled transistors connected between a resonant circuit and a tail circuit. The resonant circuit and tail circuit have respective supply connections for powering the oscillator with an external power supply and the cross-coupled transistors have a bias circuit coupled to respective gates of the cross-coupled transistors and arranged to bias said transistors in an active region of operation. The tail circuit has a current source, a tail capacitor and a tail resistor coupled between a common node of the cross-coupled transistors and the supply connection of the tail circuit.

15 Claims, 5 Drawing Sheets

(58) Field of Classification Search
USPC .......................... 331/167, 117 FE; 455/260
See application file for complete search history.

(56) References Cited

U.S. PATENT DOCUMENTS

| | | | | |
|---|---|---|---|---|
| 2003/0078016 A1* | 4/2003 | Groe | ................. | H04B 1/04 |
| | | | | 455/91 |
| 2003/0227336 A1 | 12/2003 | Wang et al. | | |
| 2010/0277207 A1 | 11/2010 | Mahdavi | | |
| 2011/0084771 A1 | 4/2011 | Nagaraj et al. | | |
| 2013/0009473 A1* | 1/2013 | Ponton | ................. | H03B 5/1234 |
| | | | | 331/34 |

OTHER PUBLICATIONS

PCT Written Opinion, mailed Feb. 24, 2021, in connection with International Application No. PCT/EP2020/065408, all pages.

Mirzaei, A. et al., "On the Mode Analysis of Coupled Oscillators", Circuits and Systems, 2009, MWSCAS '09, 52nd IEEE International Midwest Symposium, Piscataway, NJ, USA, Aug. 2, 2009, pp. 819-822.

Hegazi, E. et al., A 17-mW Transmitter and Frequency Synthesizer for 900-MHz GSM Fully Integrated in 0.35-μm CMOS, IEEE Journal of Solid-State Circuits, vol. 38, No. 5, May 2003, pp. 782-792.

Bevilacqua, A. et al., "An Analysis of 1/f Noise to Phase Noise Conversion in CMOS Harmonic Oscillators", IEEE Transactions on Circuits and Systems-I:Regular Papers, vol. 59, No. 5, Nay 2012, pp. 938-945.

Franceschin, A. et al., "A 19/5 GHZ 28 nm CMOS Class-C VCO with Reduced 1/f Noise Upconversion", 2019 IEEE, pp. 45-48.

Hegazi, E. et al., "A Filtering Technique to Lower LC Oscillator Phase Noise", IEEE Journal of Solid-State Circuits, vol. 36, No. 12, Dec. 2001, pp. 1921-1930.

Mazzanti, A. et al., "Class-C Harmonic CMOS VCOs, With a General Result on Phase Noise", IEEE Journal of Solid-State Circuits, vol. 43, No. 12, Dec. 2008, pp. 2716-2729.

Pepe, F. et al., "Suppression of Flicker Noise Up-Conversion in a 65-nm CMOS VCO in the 3.0-to-3.6 GHz Band", IEEE Journal of Solid-State Circuits, vol. 46, No. 10, Oct. 2013, pp. 2375-2389.

Groszkowski, J., "The Interdependence of Frequency Variation and Harmonic Content, and the Problem of Constant-Frequency Oscillators", Proceedings of the Institute of Radio Engineers, vol. 21, No. 7, Jul. 1933, pp. 958-981.

Yun, S. et al., "RF CMOS LC-Oscillator with Source Damping Resistors", IEEE Microwave and Wireless Components Letters, vol. 16, No. 9, Sep. 2006, p. 511-513.

\* cited by examiner

OSCILLATOR WITH BIASED CROSS-COUPLED TRANSISTORS, A CURRENT SOURCE, A TAIL RESISTOR AND A TAIL CAPACITOR

TECHNICAL FIELD

Embodiments disclosed herein relate to oscillators including methods of operating the same, for example for use in radio frequency circuits.

BACKGROUND

Low noise reference signals are important for wired and wireless communications systems. Oscillator circuits are used in many communications technologies to provide a local controlled frequency signals for the generation of transmission signals or the reception and processing of incoming signals and well as many other related processes. Accurate, efficient and low noise operation is important for correct operation of larger circuits and systems using these devices. Modern wireless communications such as existing Long Term Evolution (LTE or 4G), Fifth Generation New Radio (5G) and many others demand high data rate communications with increased bandwidth requirements and reduced noise, placing further demands on oscillator designs.

The use of Complementary Metal Oxide Semiconductor Field Effect Transistors (CMOS-FET or CMOS for short) have become ubiquitous in modern electronic circuits used in communications systems due to a number of advantages including low power consumption and low waste heat generation. However, CMOS do generate 1/f noise which can be particularly problematic in the upconversion in radio frequency transmissions circuits of baseband 1/f noise generated by CMOS oscillators. Various attempts have been made to reduce 1/f noise in oscillators.

Figure 1:
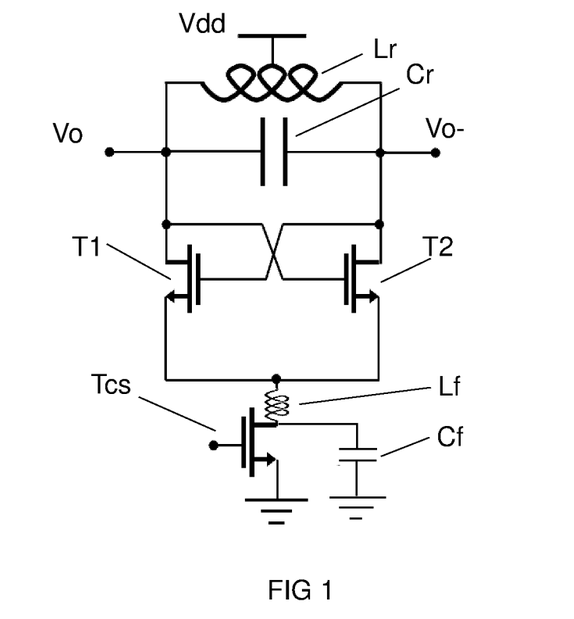
FIG. 1 is a circuit diagram of a known Class-C type oscillator.

FIG. 1 illustrates a Class-C oscillator having a noise filter. The oscillator comprises a resonant circuit having inductor Lr and capacitor Cr and cross-coupled CMOS T1 and T2 together with a tail circuit connected to the common source node of the CMOS. The tail circuit includes a current source CMOS Tcs and a noise filter having inductor Lf and capacitor Cf which raise the impedance at the common source node and has a resonant frequency twice that of the resonant frequency of the resonant circuit Lr, Cr. A problem with this technique however is that the circuit is very sensitive to the precise alignment of the resonance frequency of the noise filter with (twice) the oscillation frequency.

Figure 2:
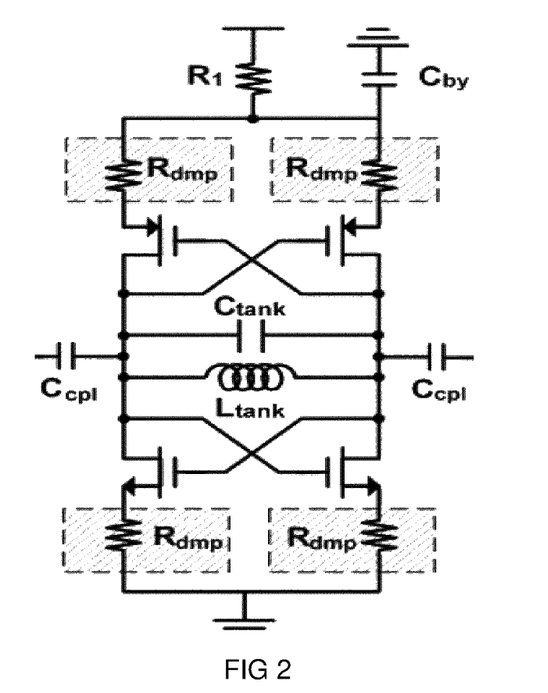
FIG. 2 is a circuit diagram of a known Class-C type oscillator having damping resistors.
Figure 3:
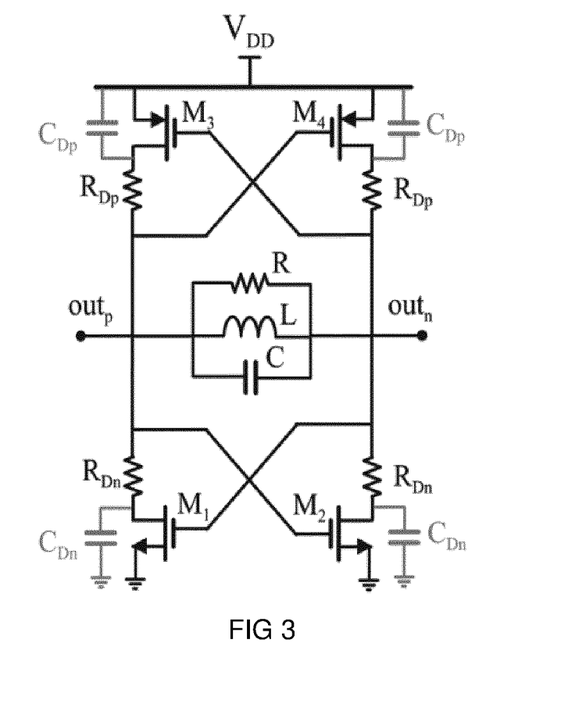
FIG. 3 is a circuit diagram of a known Class-C type oscillator having drain resistors.

S.-J. Yun, C.-Y. Cha, H.-C. Choi, and S.-G. Lee, "RF CMOS LC-Oscillator With Source Damping Resistors", IEEE Microwave and Wireless Components Letters, vol. 16, no. 9, p. 511-513, September 2006 describes an alternative approach to minimizing 1/f noise in a Class-C oscillator. This is illustrated in FIG. 2 and uses damping resistors (Rdmp) placed in series with each CMOS source. However, this approach negatively impacts the gain of each transistor. F. Pepe, A. Bonfanti, S. Levantino, C. Samori, and A. Lacaita, "Suppression of Flicker Noise Up-Conversion in a 65-nm CMOS VCO in the 3.0-to-3.6 GHz Band", IEEE J. Solid-State Circuits, vol. 48, no. 10, p. 2375-2389, October 2013 describes a further alternative approach. This is illustrated in FIG. 3 and uses resistances RD for minimizing 1/f noise upconversion which are placed in series with the drains of each transistor. However, in practice this has been found to be sensitive to parasitic capacitance.

Figure 4:
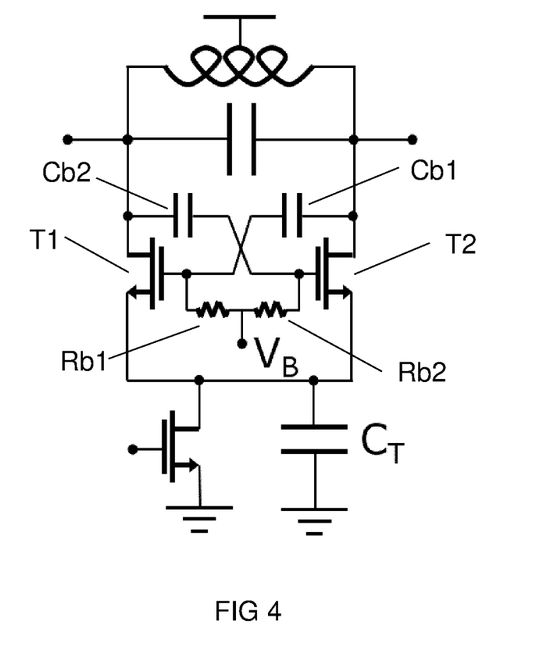
FIG. 4 is a circuit diagram of a known Class-C type oscillator.

Another more robust approach is to use a Class-C oscillator in which the CMOS are biased to operate in saturation mode. An example Class-C oscillator circuit is described in Mazzanti and Andreani, "Class-C Harmonic CMOS VCOs, With a General Result on Phase Noise", IEEE Journal of Solid State Circuits, Vol 43, No. 12, December 2008. This is illustrated in FIG. 4 in which bias circuitry Rb1, Rb2, Cb1, Cb2 are used to lower the bias voltage of the gates of the cross-coupled CMOS T1, T2 to prevent these entering the triode region of operation. A tail capacitor $C_T$ absorbs all the parasitic capacitance at the common source node and forces the transistors T1, T2 to deliver narrow current pulses rather than the overlapping rectangular current pulses delivered by Class-C operation. Whilst 1/f noise is reduced, in practice there is still 1/f noise upconversion. Therefore, there is a need for improved 1/f noise upconversion suppression.

SUMMARY

According to certain embodiments described herein there is provided an oscillator having cross-coupled transistors connected between a resonant circuit and a tail circuit. The resonant circuit and tail circuit having respective supply connections for powering the oscillator with an external power supply, and the cross-coupled transistors have a bias circuit coupled to respective gates of the cross-coupled transistors. The bias circuit is arranged to bias the cross-coupled transistors to operate in an active. The tail circuit has a current source, a tail capacitor and a tail resistor coupled between a common node of the cross-coupled transistors and the supply connection of the tail circuit.

The addition of the tail resistance to an oscillator biased for Class-C operation suppresses changes in oscillation frequency during operation of the oscillator which in turn reduces 1/f noise upconversion. This works by counteracting the Groszkowski effect in which changes in bias current due to harmonics of the oscillating frequency change the fundamental oscillation frequency of the oscillator.

According to certain embodiments described herein there is provided a method of operating an oscillator having cross-coupled transistors connected between a resonant circuit and a tail circuit having a current source, a tail capacitor and a tail resistor coupled to a common node of the cross-coupled transistors. The method comprises controlling the cross-coupled transistors using the tail resistor and control voltages applied to gates of the cross-coupled transistors to operate in an active region and to suppress any change in oscillation frequency during operation of the oscillator.

BRIEF DESCRIPTION OF DRAWINGS

For a better understanding of the embodiments of the present disclosure, and to show how it may be put into effect, reference will now be made, by way of example only, to the accompanying drawings, in which.

DESCRIPTION

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

The following sets forth specific details, such as particular embodiments or examples for purposes of explanation and not limitation. It will be appreciated by one skilled in the art that other examples may be employed apart from these specific details. In some instances, detailed descriptions of well-known methods, nodes, interfaces, circuits, and devices are omitted so as not obscure the description with unnecessary detail. Those skilled in the art will appreciate that the functions described may be implemented in one or more nodes using hardware circuitry (e.g., analog and/or discrete logic gates interconnected to perform a specialized function, ASICs, PLAs, etc.) and/or using software programs and data in conjunction with one or more digital microprocessors or general purpose computers. Nodes that communicate using the air interface also have suitable radio communications circuitry. Moreover, where appropriate the technology can additionally be considered to be embodied entirely within any form of computer-readable memory, such as solid-state memory, magnetic disk, or optical disk containing an appropriate set of computer instructions that would cause a processor to carry out the techniques described herein.

Hardware implementation may include or encompass, without limitation, digital signal processor (DSP) hardware, a reduced instruction set processor, hardware (e.g., digital or analogue) circuitry including but not limited to application specific integrated circuit(s) (ASIC) and/or field programmable gate array(s) (FPGA(s)), and (where appropriate) state machines capable of performing such functions. Memory may be employed to storing temporary variables, holding and transfer of data between processes, non-volatile configuration settings, standard messaging formats and the like. Any suitable form of volatile memory and non-volatile storage may be employed including Random Access Memory (RAM) implemented as Metal Oxide Semiconductors (MOS) or Integrated Circuits (IC), and storage implemented as hard disk drives and flash memory.

Embodiments described herein relate to methods and circuitry for oscillators with reduced 1/f noise by suppressing changes in oscillation frequency, for example due to harmonic waveforms of the oscillation frequency in the bias currents of transistors used to drive the oscillators. This is achieved by tuning the tail impedance of the oscillator using a tail resistor having a suitable value.

Figure 5:
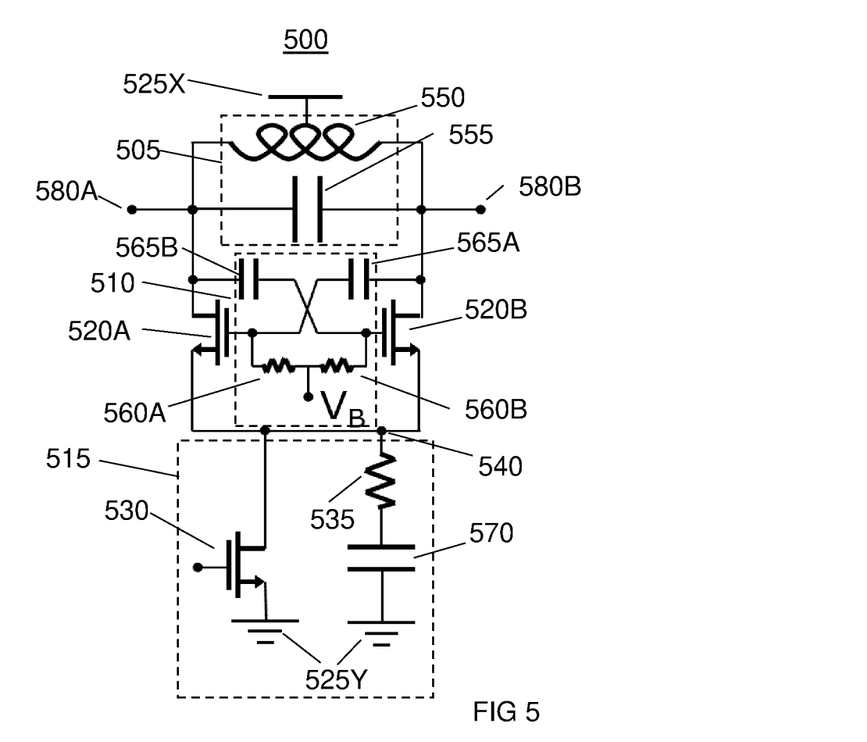
FIG. 5 is a circuit diagram of an oscillator according to an embodiment.

FIG. 5 is a circuit diagram of an oscillator according to an embodiment. The oscillator 500 comprises cross-coupled transistors 520A, 520B connected between a resonant circuit 505 and a tail circuit 515.

The cross-coupled transistors 520A, 520B may be Complementary Metal Oxide Semiconductor Field Effect Transistors (CMOS), each having a drain, source and gate connection, although other types of transistor could alternatively be used. In the embodiment, the CMOS 520A, 520N have their sources connected at a common source node 540 connected to the tail circuit 515. The drain of each CMOS 520A, 520B is coupled to the gate of the other CMOS 520B, 520A by a bias circuit 510.

The resonant circuit 505 is also connected to a supply connection 525X, for example a positive DC voltage Vdd, and comprises an inductor Lr and capacitor Cr connected in parallel. The inductance and capacitance values of the inductor Lr and capacitor Cr determine the resonance or natural frequency wo of the resonance circuit.

The bias circuit 515 comprises bias capacitors 565A and 565B connecting respectively the drain of transistor 520B with the gate of transistor 520A, and the drain of transistor 520A with the gate of transistor 520B. Bias resistors 560A and 560B respectively connect the gates of transistors 520A and 520B with bias voltage VB. The values of the bias resistors 560A, 560B, bias capacitors 565A, 565B and bias voltage VB are arranged to ensure that the cross-coupled transistors 520A, 520B operate in an active region where the drain-source current is dependent on the gate-source voltage. This is the saturation region in CMOS transistors, and the CMOS 520A, 520B are biased to avoid entering the triode region. In an embodiment the value of the bias resistors are large enough to introduce negligible degradation of the oscillation amplitude but not so large as to degrade phase noise. This may be optimised experimentally or using simulation software for example.

The tail circuit 515 comprises a current source 530 connected between the common source node 540 and another supply connection 525Y which may be a DC ground or negative voltage compared with the first supply connection 525Y at a positive DC voltage Vdd. The current source may be another CMOS suitably configured. The tail circuit also comprises tail resistor 535 connected between the common source node 540 and a tail capacitor 570. The tail capacitor 570 is also connected to the second supply connection 525Y.

The value of the tail capacitor 570 is sufficiently large so that when combined with the cross-coupled transistors 520A, 520B operating in the active region, impulse like current waveforms are generated resulting in Class-C type operation (where the transistors always operate in the active region) with reduced phase noise. The tail capacitor is large enough to act as a very low impedance at the oscillation frequency.

The value of tail resistor 535 is sufficiently large to force the oscillator to oscillate at very close to the resonance frequency of the resonance circuit and to suppress changes in frequency of the oscillator. This further reduces the upconversion of CMOS 1/f noise.

A significant cause of 1/f noise upconversion is through the Groszkowski effect which relates the actual oscillation frequency of the oscillator to the harmonic content of the current waveforms flowing into the resonant circuit. The natural frequency or resonance angular frequency of the LC tank is exactly $\omega_0 = 1/\sqrt{LC}$ (assuming for simplicity but without loss of generality that all inductive and capacitive losses can be compacted into an equivalent parallel tank resistance (not shown in the figures), The oscillation frequency, however, departs from $\omega_0$ by the slight shift $\delta\omega$, due to the presence of current harmonics beyond the fundamental. As noted in Groszkowski "The interdependence of frequency variation and harmonic content, and the problem of constant-frequency oscillators", Proceedings of the IRE, vol 21, pp. 958-981, 1933, this can be predicted by the following equation:

$$\delta\omega = \frac{\sum_{k=2}^{\infty}(-1)^k k\, n_k^2\, Z_k|_{Im}}{2R_1^2 C} \quad (1)$$

where $\delta\omega$ may be negative or positive, depending on the specific harmonic content of the current generate by the CMOS transistors; $Z_k|_{in}$ is the imaginary part of the resonant circuit impedance at the k-th harmonic of the oscillation frequency; $R_1$ is the parallel resonant circuit resistance; and $n_k$ is defined as $$n_k = \left|\frac{I_k}{I_1}\right| \quad (2)$$

with $I_k$ the k-th harmonics of the current flowing into the resonant circuit 505.

This means that the sum of bias current and 1/f current noise from the tail CMOS transistor 530 can be modeled as a slowly varying bias current. If the bias current varies, $n_k$ will also vary and results in a slow modulation of $\delta\omega$ i.e., phase noise. It has been found that it is possible to find a bias point for the oscillator for which a slight modulation of the tail current does not result in any modulation of $\delta\omega$, thereby preventing 1/f noise upconversion. This has been found to occur when the oscillation frequency of the oscillator is very close to the resonant frequency $\omega_0$ of the resonant circuit 505. When the oscillation frequency is $\omega_0$, the 1/f noise upconversion falls well below the level of the upconverted white noise up to very small frequency offsets, becoming negligible.

This is also the case for upconversion of 1/f noise from the cross-coupled pair of CMOS 525A, 525B. In a Class-B topology such as that of FIG. 1, the CMOS current waveform only contains odd harmonics and it can then be seen from (1) that the change in frequency ow will always be negative. In an oscillator working in deep Class-C, on the other hand, there are strong even current harmonics, and $\delta\omega$ is positive. Therefore, by forcing an oscillator to work in (what is here called 'class-BC') between these two operational conditions (i.e. Class-B and Class-C), the negative and positive changes in frequency Ow cancel each other and can therefore be reduced or eliminated.

To achieve this, the impedance of the tail capacitor 570 is modified with a series resistance 535, as shown in FIG. 5. The tail resistor 535 is used to tune the tail impedance to ensure that the oscillator oscillates at $\omega_0$ to suppress changes in oscillation frequency to minimize the 1/f noise upconversion. This can be determined experimentally for different values of tail capacitance 570.

The output of the oscillator 500 is an oscillation signal provided across the resonant circuit 505 at output connections 580A and 580B.

In practice, the oscillator may be designed for a particular oscillation frequency using known techniques such as biasing the cross-coupled transistors 520A, 520B at half the supply voltage and selecting a tail capacitor 570 to optimize operation as previously described. This may be achieved using circuit simulation software and/or circuit hardware prototyping. The tail resistor 535 may then be selected or adjusted until the 1/f noise is minimized, again using circuit simulation software and/or circuit hardware prototyping. Once optimized, the values of the various components 560A, 560B, 565A, 565B, 570 and 535 may be employed for manufacturing.

Figure 8:
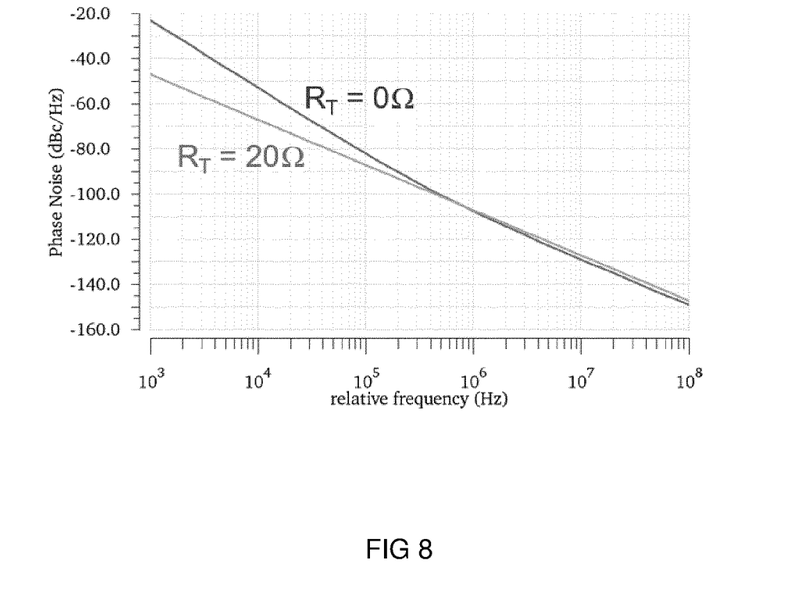
FIG. 8 illustrates phase noise in a known Class-C oscillator and an oscillator according to an embodiment.

In some designs using this approach, having a tail resistor 535 having a value greater than 1 ohm is sufficient to reduce upconversion of 1/f noise compared with not having a tail resistor. FIG. 8 is a graph of phase noise for a tail resistance of 0 ohms and 20 ohms. It can be seen that the use of the tail resistor 535 significantly reduces low frequency phase noise.

More generally, a suitable value for the tail resistor 535 can be calculated by using a simplified model of the oscillator, where the only relevant harmonics of the voltage between gate and source of each transistor are: the first (fundamental) harmonic at the gate, and the second and fourth harmonics at the source, all other harmonics being negligibly small. Assuming further that the MOS transistor obeys a quadratic voltage-to-current law typical of ideal MOS transistors, a value of the tail resistor 535, which determines the amplitude of the mentioned second and fourth voltage harmonics (and, to a much lesser extent, that of the fundamental voltage harmonic), can be derived by imposing a relationship between the second and third current harmonics ($I_k$, with k=2 and k=3 respectively) for which equation (1) tends to zero. While such a relationship depends, to some extent, on the design details of the LC tank (and, especially, its capacitance), as well as on the amplitude of the neglected higher-order current harmonics, the third current harmonic is generally in the range of 1-1.5 times the second current harmonic. This model can therefore provide a suitable value for the tail resistor 535 for a combination of the relevant design parameters, including e.g.
bias current,
a gain factor of the CMOS transistors 520A, 520B, and
the equivalent parallel tank resistance mentioned above, which is equal to the quality factor of the LC tank multiplied by the impedance of the tank inductance (or capacitance) at resonance. Based on these considerations, suitable values for the tail resistor 535 may typically vary e.g. between 0.5 and 0.8 times the equivalent parallel tank resistance, for reasonable values of the above-mentioned parameters. Since the equivalent parallel tank resistance is a very large impedance, relatively speaking (from hundreds of Ohm in the lower GHz range, to tens of Ohm at mm-wave), it is impossible to inadvertently introduce a parasitic resistance with a value close to that of the tail resistor 535 by means of a sub-optimal circuit design, even accounting for the fact that real MOS transistors may depart from the ideal quadratic voltage-to-current law.

Figure 7:
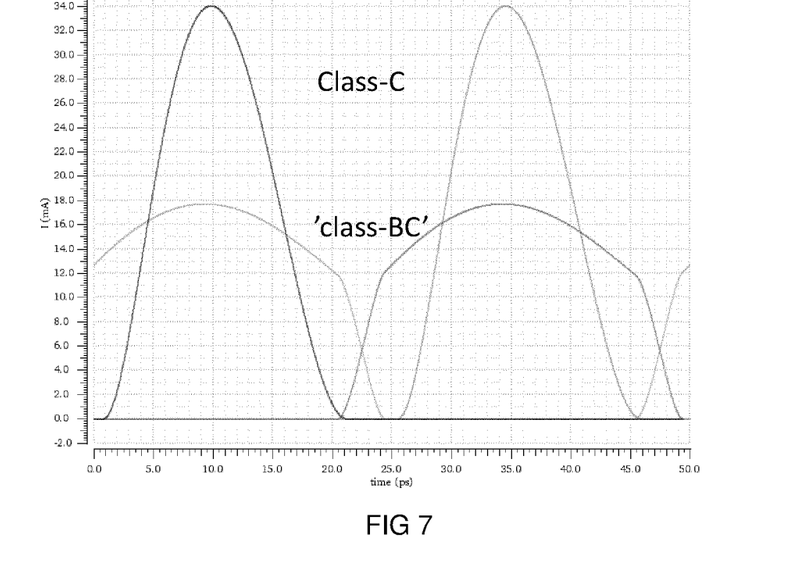
FIG. 7 illustrates current waveforms in a known Class-C oscillator and an oscillator according to an embodiment.

FIG. 7 is a graph illustrating current waveforms of a Class-C oscillator showing the narrow impulses and the 'class-BC' type operation of the embodiment. These show currents through the left and right cross-coupled transistors without the tail resistor (tall narrow waveforms) and with the tail resistor (flattened wider waveforms). As can be seen the waveform of the embodiment is in between the Class-C waveform and a Class-B waveform having overlapping rectangular waveforms.

This approach renders the oscillator insensitive to 1/f noise upconversion in a robust way, as it is independent of the specific form of the 1/f noise, the only relevant characteristic being its low-frequency nature. A minor drawback is caused by a lower current efficiency in 'class-BC' compared to deep Class-C, resulting in 1-2 dB higher phase noise in the upconverted white noise region. However, this is more than compensated for by much reduced low frequency phase noise.

Both the tail capacitor 570 and the tail resistor 535 may be made tunable, to minimize the 1/f noise upconversion in the presence of process, voltage and temperature variations.

Alternative bias circuit arrangements can be used, for example using a transformer where one winding is used for the resonant inductor and the other winding is connected to the CMOS gates and has a center-tapped connection to the bias voltage. The resonant capacitor may be tunable and/or have switchable capacitor banks for coarse and fine tuning. In another alternative, the cross-coupled transistors may be other types of Metal Oxide Semiconductor Field Effect Transistors (MOSFET) or Bipolar Junction Transistors (BJT)

Figure 6:
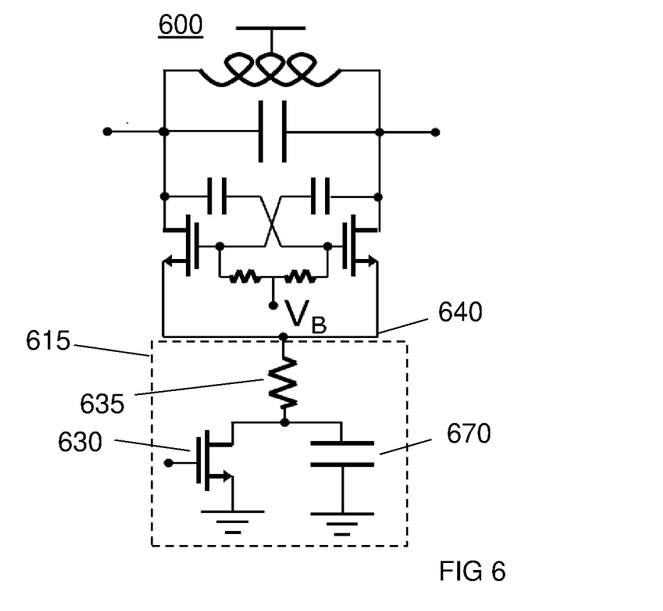
FIG. 6 is a circuit diagram of an oscillator according to another embodiment.

FIG. 6 is a circuit diagram of an oscillator according to another embodiment. The architecture is similar to that of FIG. 5 and common components are not labelled. The oscillator 600 has a modified tail circuit 615 in which the tail resistor 635 is connected in series with the tail capacitor 670 and current source 630, with the tail capacitor 670 and current source being connected in parallel. This approach separates the parasitic capacitance of the current source transistor 630 from that of the common source node 640 to reduce the impact of the parasitic capacitance in cases where the combination of these parasitic capacitances is of the same order as the capacitance of the tail capacitor 670.

Figure 9:
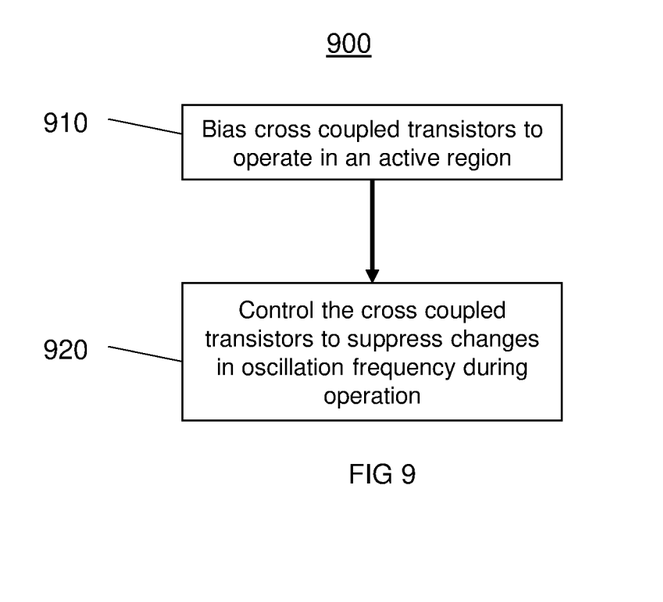
FIG. 9 is a flow chart illustrating a method of operating an oscillator according to an embodiment.

FIG. 9 illustrates a method of operating an oscillator. The method 900 may be used with either of the embodiments of FIG. 5 or 6, as well as any other oscillator having cross-coupled transistors connected between a resonant circuit and a tail circuit where the tail circuit has a current source, a tail capacitor and a tail resistor coupled to a common node of the cross-coupled transistors.

At 910, the cross-coupled transistors are biased to operate in an active region, for example the saturation region for CMOS transistors. This ensures that the CMOS do not enter the triode region and the oscillator operates not in Class-C but in Class-C where the CMOS drain-source current is related to the gate voltage rather than acting as switches. This also causes the current waveforms to be curved and not overlapping.

At 920, the cross-coupled transistors are controlled to suppress changes in oscillation frequency during operation. This can be achieved by forcing the oscillator to oscillate at the resonant frequency of the resonant circuit. At this resonant frequency, changes in gate voltage caused by harmonics have little effect on the oscillation frequency. In some embodiments, this can be achieved by tuning the tail impedance using a tail capacitor and a tail resistor. These may be selected dependent on the other components of the oscillator circuit, or may be tuned in situ.

Figure 10:
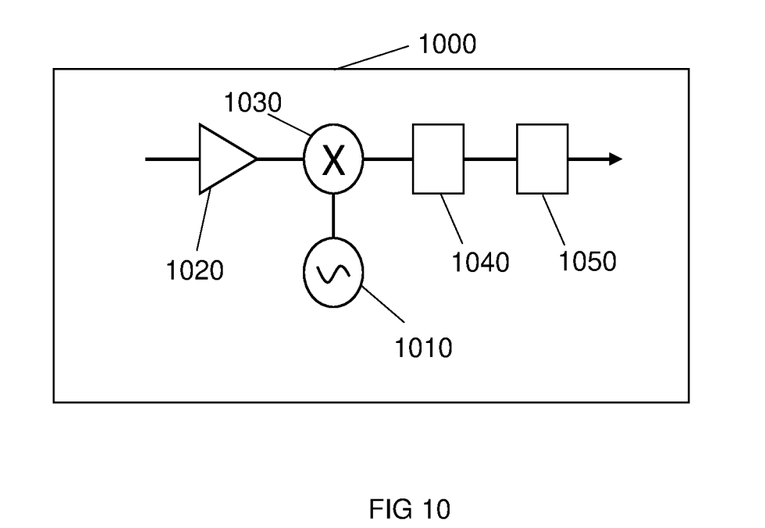
FIG. 10 is a schematic diagram illustrating application of an oscillator according to an embodiment in a device such as telecommunications user equipment or base station equipment.

FIG. 10 is a schematic diagram illustrating application of an oscillator according to an embodiment in a device. The device may be a telecommunications device such as user equipment (UE) or base station equipment and may be used to upconvert baseband signals to higher frequency signals. A UE 1000 comprises an oscillator 1010 according to an embodiment, for example using the circuit of FIG. 5 or 6. This may be implemented as a phase lock loop, voltage controlled oscillator or other type of local oscillator. The oscillator 1010 may generate an unmodulated radio frequency signal or any intermediate frequency signal.

A baseband or information signal is received by a low noise amplifier 1020 which amplifies this and outputs to a mixer 1030. The mixer 1030 mixes the amplified baseband signal with the output of the oscillator 1010 to output an upconverted baseband or modulated radio or intermediate frequency signal. Any suitable mixer may be used, for example generating sum and difference signals of the baseband and oscillator signal inputs. The presence of 1/f noise is reduced by using an oscillator 1010 according to an embodiment compared with known oscillator arrangements.

The output of the mixer 1030 is fed to a low pass filter 1040 which further reduces low frequency signal components and the filtered signal is then fed an analog-to-digital converter 1050 to enable further digital processing of the upconverted information or baseband signal.

The embodiments provide the advantage of reducing 1/f noise upconversion in an oscillator in a robust way. This may be useful for RF applications in communications systems, but also other communications applications and more generally oscillator use in any electronics application.

Modifications and other variants of the described embodiment(s) will come to mind to one skilled in the art having the benefit of the teachings presented in the foregoing descriptions and the associated drawings. Therefore, it is understood that the embodiment(s) is/are not limited to the specific examples disclosed and that modifications and other variants are intended to be included within the scope of this disclosure. Although specific terms may be employed herein, they are used in a generic and descriptive sense only and not for purposes of limitation.

The invention claimed is:

1. An oscillator having cross-coupled transistors connected between a resonant circuit and a tail circuit, the resonant circuit and tail circuit having respective supply connections for powering the oscillator with an external power supply, the cross-coupled transistors having a bias circuit coupled to respective gates of the cross-coupled transistors and arranged to bias said transistors in an active region of operation, the tail circuit having a current source, a tail capacitor and a tail resistor coupled between a common node of the cross-coupled transistors and the supply connection of the tail circuit, wherein the tail capacitor is connected in series with the tail resistor.

2. The oscillator of claim 1, wherein the tail resistor is connected to the current source.

3. The oscillator of claim 1, wherein the tail resistor is connected in parallel with the current source.

4. The oscillator of claim 1, wherein the tail resistor has a resistance greater than 1 ohm.

5. The oscillator of claim 4, wherein the tail resistor has a resistance greater than or equal to 20 ohms.

6. The oscillator of claim 1, wherein the cross-coupled transistors and the current source are CMOS FETs.

7. The oscillator of claim 1, wherein the tail resistor and bias circuit are arranged to control the cross-coupled transistors to oscillate at a natural frequency of the resonant circuit.

8. The oscillator of claim 1, wherein the tail resistor and bias circuit are arranged to control the cross-coupled transistors to suppress any change in oscillation frequency of the oscillator during use.

9. The oscillator of claim 1, wherein the resonant circuit comprises a resonant inductor and a resonant capacitor connected in parallel to respective drains of the transistors; and wherein the bias circuit has bias resistors connected between a bias voltage and respective gates of the cross-coupled transistors and bias capacitors connected between a drain of a respective cross-coupled transistor and the gate of the other cross-coupled transistor.

10. A method of operating an oscillator having cross-coupled transistors connected between a resonant circuit and a tail circuit having a current source, a tail capacitor and a tail resistor coupled to a common node of the cross-coupled transistors, wherein the tail capacitor is connected in series with the tail resistor, the method comprising:
controlling the cross-coupled transistors using the tail resistor and control voltages applied to gates of the cross-coupled transistors to operate in an active region and to suppress any change in oscillation frequency during operation of the oscillator.

11. The method of claim 10, wherein the cross-coupled transistors are controlled such that the oscillation frequency is a natural frequency of the resonant circuit.

12. The method of claim 10, wherein controlling the cross-coupled transistors comprises biasing the cross-coupled transistors to operate in the active region using a bias circuit connected to the gates and tuning the tail resistor suppress any change in oscillation frequency during operation of the oscillator.

13. The method of claim 10, wherein the tail resistor has a resistance greater than 1 ohm.

14. A communications device having an oscillator according to claim 1.

15. The communications device of claim 14 comprising a mixer coupled to the oscillator and arranged to upconvert a received baseband signal using an oscillation signal generated by the oscillator.

* * * * *

UNITED STATES PATENT AND TRADEMARK OFFICE
CERTIFICATE OF CORRECTION

PATENT NO. : 12,199,568 B2
APPLICATION NO. : 17/928316
DATED : January 14, 2025
INVENTOR(S) : Pietro Andreani It is certified that error appears in the above-identified patent and that said Letters Patent is hereby corrected as shown below:

In the Specification

In Column 1, Line 64, delete "RD" and insert -- $R_D$ --, therefor.

In Column 4, Line 33, delete "VB." and insert -- $V_B.$ --, therefor.

In Column 4, Line 35, delete "VB" and insert -- $V_B$ --, therefor.

In Column 5, Line 6, delete "$\omega_0 = 1/\sqrt{LC}$ (assuming" and insert -- $\omega_0 = 1/\sqrt{LC}$ assuming --, therefor.

In Column 5, Line 26, delete "$Z_k|_{in}$," and insert -- $Z_k|_{Im}$ --, therefor.

In Column 5, Line 55, delete "ow" and insert -- $\delta\omega$ --, therefor.

In Column 5, Line 61, delete "Ow" and insert -- $\delta\omega$ --, therefor.

Signed and Sealed this
Tenth Day of June, 2025

Coke Morgan Stewart
*Acting Director of the United States Patent and Trademark Office*